(12) United States Patent
Chen et al.

(10) Patent No.: US 12,176,906 B2
(45) Date of Patent: Dec. 24, 2024

(54) PWM-BASED CONTINUOUS CLOCK SERIAL INTERFACE

(71) Applicant: TEXAS INSTRUMENTS INCORPORATED, Dallas, TX (US)

(72) Inventors: Huihuang Chen, Shenzhen (CN); Yan Zou, Suzhou (CN)

(73) Assignee: Texas Instruments Incorporated, Dallas, TX (US)

( * ) Notice: Subject to any disclaimer, the term of this patent is extended or adjusted under 35 U.S.C. 154(b) by 56 days.

(21) Appl. No.: 18/308,005

(22) Filed: Apr. 27, 2023

(65) Prior Publication Data

US 2024/0364321 A1 Oct. 31, 2024

(51) Int. Cl.
*H03K 7/08* (2006.01)
*G06F 13/42* (2006.01)
*H03K 3/011* (2006.01)

(52) U.S. Cl.
CPC ........... *H03K 7/08* (2013.01); *G06F 13/4291* (2013.01); *H03K 3/011* (2013.01)

(58) Field of Classification Search
CPC ....................................................... H03K 7/08
USPC ............................................................ 332/109
See application file for complete search history.

(56) References Cited

U.S. PATENT DOCUMENTS 9,111,047 B1\* 8/2015 Shridhar ................. G06F 13/40
2016/0119168 A1\* 4/2016 Roy ......................... H04B 1/16
375/238

\* cited by examiner

*Primary Examiner* — Joseph Chang
(74) *Attorney, Agent, or Firm* — Brian D. Graham; Frank D. Cimino

(57) ABSTRACT

A circuit includes a microcontroller having a clock output and a data output. The microcontroller includes a serial-peripheral interface (SPI) circuit, a pulse-width modulation (PWM) generator, and a central processing unit (CPU). The SPI circuit is configured to provide an SPI clock signal and an SPI data signal to the data output. The PWM generator is configured to provide a continuous PWM signal to the clock output. The CPU is coupled to the SPI circuit and the PWM generator, and the CPU has executable instructions configured to synchronize the PWM signal to the SPI clock signal.

20 Claims, 5 Drawing Sheets

PWM-BASED CONTINUOUS CLOCK SERIAL INTERFACE

TECHNICAL FIELD

This description relates to a pulse-width-modulation (PWM-) based continuous clock serial interface.

BACKGROUND

A typical microcontroller includes one or more central processing units, memory, and programmable input/output peripherals. In some examples, a microcontroller includes a serial peripheral interface (SPI) for data communication. The SPI is a synchronous serial communication interface that is often used for short-range communication, such as for secure digital cards and displays (e.g., liquid-crystal displays (LCD) and light emitting diode (LED) displays). For example, an SPI bus includes a serial clock line, serial data output line, and a serial data input line, and can operate with a single master device having one or more slave devices. Data transmission can occur with each cycle of the clock signal, and the clock signal is terminated after the data transmission is complete.

SUMMARY

One example described herein relates to a circuit that includes a microcontroller having a clock output and a data output. The microcontroller includes a serial-peripheral interface (SPI) circuit, a pulse-width modulation (PWM) generator, and a central processing unit (CPU). The SPI circuit is configured to provide an SPI clock signal and an SPI data signal to the data output. The PWM generator is configured to provide a continuous PWM signal to the clock output. The CPU is coupled to the SPI circuit and the PWM generator, and the CPU has executable instructions configured to synchronize the PWM signal to the SPI clock signal.

Another example relates to a method that includes providing a serial-peripheral interface (SPI) clock signal from an SPI circuit of a microcontroller based on a command to provide SPI output data to a data output of the microcontroller. The method also includes providing a continuous pulse-width modulation (PWM) signal to a clock output of the microcontroller. The method also includes synchronizing, by a central processing unit (CPU) of the microcontroller, the PWM signal to the SPI clock signal based on the command to provide the SPI output data.

Another described example relates to a system that includes a microcontroller and an output circuit, in which the microcontroller has a clock output and a data output. The microcontroller includes a serial-peripheral interface (SPI) circuit, a pulse-width modulation (PWM) generator, and a central processing unit (CPU). The SPI circuit is configured to provide an SPI clock signal and an SPI data signal, in which the SPI data signal is provided to the data output. The PWM generator is configured to provide a continuous PWM signal to a PWM output having a 50% duty cycle and a frequency that matches a frequency of the SPI clock signal. The CPU is coupled to the SPI circuit and the PWM generator, and the CPU has executable instructions configured to synchronize the PWM signal to the SPI clock signal. The output circuit has a clock input and a data input, in which the clock input is coupled to the PWM output and the data input is coupled to the data output.

DETAILED DESCRIPTION

This description relates to a pulse-width-modulation- (PWM-) based continuous clock serial interface, such as can provide both a continuous clock and data communication.

As an example, a microcontroller includes a pulse-width modulation (PWM) generator, a serial-peripheral interface (SPI) circuit and a central processing unit (CPU). The SPI circuit is configured to provide an SPI clock signal to an SPI clock output thereof and an SPI data signal to a data output of the microcontroller. The PWM generator is configured to provide a continuous PWM signal at an output of the microcontroller, in which the PWM signal has a 50% duty cycle and a frequency that matches a frequency of the SPI clock signal. The CPU is coupled to the SPI circuit and the PWM generator, and the CPU includes executable instructions configured to synchronize the continuous PWM signal with the SPI clock signal. While a microcontroller is disclosed above and throughout the remainder of this detailed description, another type of semiconductor device, such as an integrated circuit (IC) or system on chip (SOC), could be substituted for the microcontroller in the example embodiments described herein.

In some examples, output circuits are configured to use an external continuous clock for both cycling input data and other circuit functions. The microcontroller described herein thus is configured to provide the PWM signal at a given output of the microcontroller as a continuous clock signal and to provide the SPI data at a data output. As described herein, the SPI data that is transmitted can be synchronized with the continuous clock signal (the PWM signal). Accordingly, the output circuit can have a clock input coupled to the given output of the microcontroller (e.g., the output that provides the continuous PWM signal), and a data input coupled to the data output of the microcontroller. As a result, the normal operation of the output circuit can be supported by configuring the microcontroller, as described herein, to implement a continuous clock serial interface instead of a synchronous serial interface.

Figure 1:
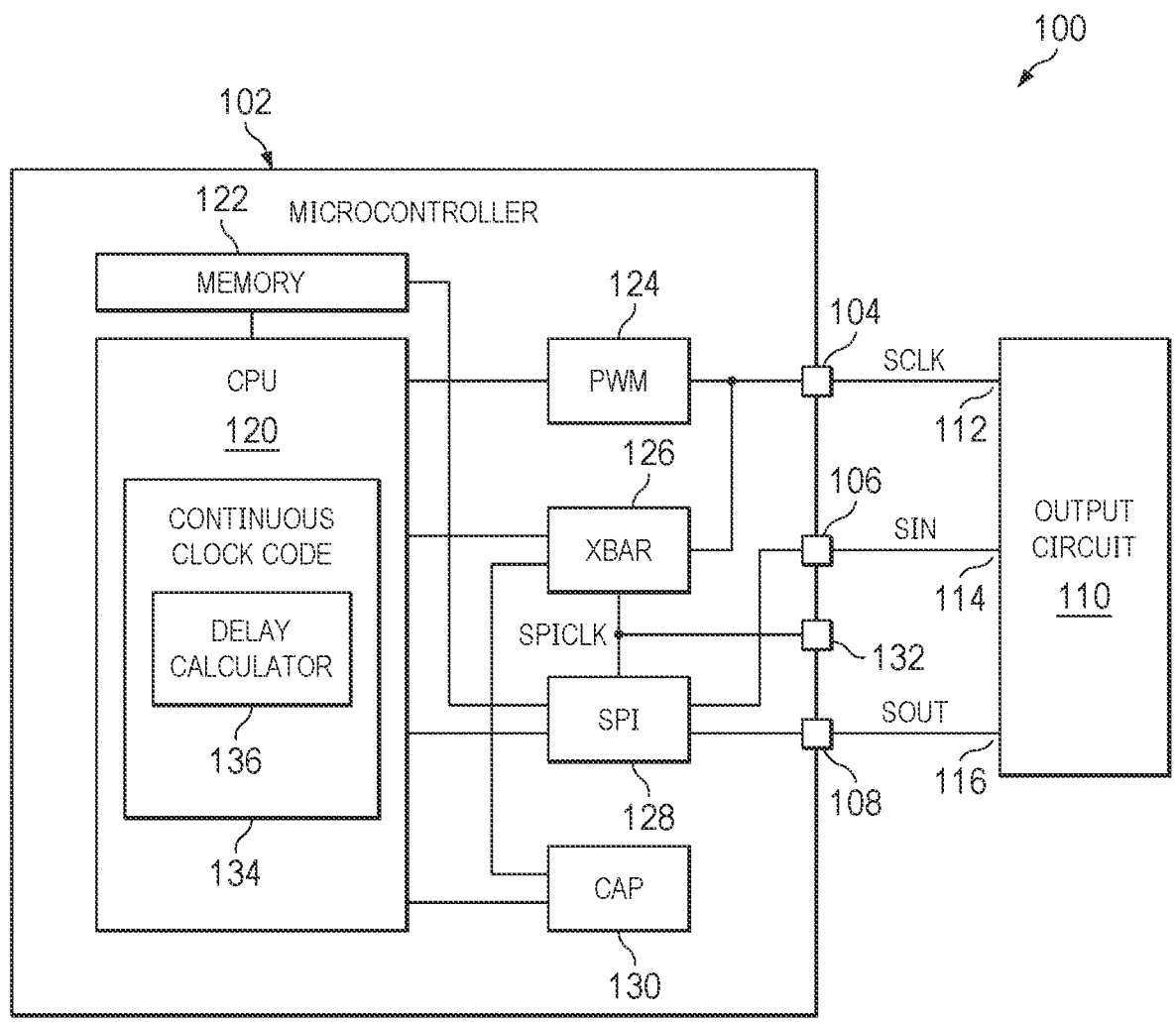
FIG. 1 is a schematic diagram of an example system to implement a continuous clock serial interface.

FIG. 1 is a schematic diagram of an example system 100 configured to implement a continuous clock serial interface. The system includes a microcontroller 102 (or an IC or SOC) having a PWM output terminal 104, a data output terminal 106 and a data input terminal 108. As described herein, the microcontroller 102 is configured to provide a continuous clock signal at the PWM output terminal 104 and communicate data at the data output terminal 106. In an example where the microcontroller 102 is communicating bidirectional data, the microcontroller 102 can be configured to receive data at the data input terminal 108. As described herein, the terminals 104, 106 and 108 can form or be part of a continuous clock serial interface.

One or more output circuits 110 can be coupled to the microcontroller 102. For example, the output circuit 110 has a clock input 112, a data input 114 and a data output 116, in which the clock input 112 is coupled to the PWM output terminal 104, the data input 114 is coupled to the data output terminal 106, and the data output 116 is coupled to the data input terminal 108. In an example, the microcontroller 102 and output circuit 110 are implemented on a circuit board or another substrate, in which the connections between respective inputs and outputs can be by way of wires or traces. As an example, the output circuit 110 can include one or more digital cards or displays (e.g., liquid-crystal displays (LCD) and light emitting diode (LED) displays), in which the output data provided at data output 116 is provided to control the digital card or display accordingly.

The microcontroller 102 includes one or more CPUs (or other processor cores) 120 and memory 122. The microcontroller 102 also includes peripheral circuitry, which can be programmable in response to commands or other instructions provided by the CPU 120. In the example of FIG. 1, the peripheral circuitry includes a PWM generator circuit 124, a crossbar (XBAR) circuit 126, an SPI circuit 128 and capture (CAP) circuitry 130. The CPU 120 thus can be coupled to the peripheral circuitry, including the PWM generator 124, the XBAR circuit 126, the SPI circuit 128 and the CAP circuitry 130. The CPU 120 can be coupled to the SPI circuit 128 and the PWM generator 124 directly and/or through the XBAR circuit 126. The CAP circuitry 130 can be coupled to the XBAR circuitry 126 and to the CPU 120. As described herein, the CAP circuitry 130 can be configured to capture and process signals (e.g., from the PWM generator 124 and the SPI circuit 128) as directed by the XBAR circuitry 126, which can be responsive to instructions from the CPU 120.

In addition or as an alternative to the example of FIG. 1, the microcontroller 102 can include a number of one or more other circuit modules configured to perform other respective functions, which can vary depending on intended applications of the microcontroller. The CPU 120 and the peripheral circuitry 124, 126, 128, 130 shown in FIG. 1 similarly can be configured to perform additional functions from those described herein. The microcontroller 102 can be used in a variety of applications and thus be configured accordingly.

The SPI circuit 128 can implement a serial communication bus having an SPI clock output, an SPI data output, and an SPI data input (e.g., according to an SPI specification). In the example of FIG. 1, the SPI clock output is coupled to an output terminal 132 of the microcontroller 102, which is also coupled to an input of the XBAR circuitry 126. The SPI data output and an SPI data input are coupled, respectively, to the data output terminal 106 and data input terminal 108 of the microcontroller. In an example, the SPI circuit 128 can be implemented as a master module in the system 100 configured to provide an SPI clock signal (SPICLK) to the SPI clock output terminal 132 and an SPI data output signal to the data output terminal 106. For example, the SPI circuit 128 is configured to provide the SPI clock signal as a serial clock signal and the SPI data signal as a master-out slave-in logic signal according to the SPI specification. The SPI circuit 128 can provide SPI data output signal to the data output terminal 106 based on data provided by the CPU 120. Alternatively, the SPI circuit 128 can be configured to operate in a direct memory access (DMA) mode, in which the SPI circuit 128 is configured to access the memory 122 independently of the CPU 120 and provide the SPI data signal based on the DMA-accessed data. The SPI circuit 128 further can be configured to receive an input data signal from the output circuit 110 through the data input terminal 108 and provide the input data to the CPU 120. The SPI data input can constitute a master-in slave-out logic signal according to the SPI specification.

The PWM generator 124 has a PWM output coupled to the PWM output terminal 104 and is configured to provide a PWM signal as a continuous clock signal to the PWM output terminal 104. The PWM signal at PWM output terminal 104 can have a 50% duty cycle and a frequency that matches a frequency of the SPI clock signal. In the example of FIG. 1, the XBAR circuitry 126 also has an input coupled to PWM output terminal 104, and thus receives the continuous PWM signal provided by the PWM generator 124. In some examples, the outputs of the PWM generator 124 and the SPI circuit 128 can be coupled to the respective terminals 104, 106, 108 and 132 of the microcontroller through an interface circuit (not shown) such as a general purpose input/output multiplexer.

As a further example, the CPU 120 includes executable instructions that include continuous clock code 134. The continuous clock code 134 is configured to control the PWM generator 124, the SPI circuit 128, and the CAP circuitry 130 to synchronize the continuous PWM signal to the SPI clock signal and provide the PWM signal as a continuous serial clock signal (SCLK) at PWM output terminal 104 to enable the output circuit 110 to receive and use the data (SIN) provided at data output terminal 106. The continuous clock code 134 can be invoked periodically or intermittently, such as in response to instructions (e.g., an interrupt request) to provide output data through the SPI circuit 128.

In one example, the continuous clock code 134 is invoked responsive to a compensation activation signal having a value representative of a clock compensation mode. The compensation activation signal can be provided to indicate clock compensation mode responsive to detecting SPI output data that is ready to send through the SPI circuit 128. Additionally, or alternatively, the compensation activation signal can be provided at startup (e.g., at power up) for the system 100. For example, the SPI output data, which is provided at data output terminal 106, can be used to configure, control or otherwise operate one or more features of the output circuit 110. To enable proper transmission of SPI output data to the output circuit 110, the continuous PWM signal (e.g., the serial clock signal SCLK) at PWM output terminal 104 is synchronized to the SPI clock signal at output terminal 132.

As an example, the continuous clock code 134 is configured to enter the clock compensation mode for a duration responsive to the compensation activation signal indicating the clock compensation mode to control the CPU 120 to provide dummy data to the SPI circuit 128. The SPI circuit 128 is configured to provide the dummy data as output data to the data output terminal 106. For example, the dummy data can be provided over a number (e.g., two or more) of clock periods of the PWM signal at PWM output terminal 104, or the dummy data can be a number of bits. The amount of the dummy data can be fixed or variable (e.g., programmable responsive to setting a duration parameter), and provides a sufficient amount of time to complete the synchronization. As used herein, the term dummy data refers to benign information having no intended effect on the output circuit 110 other than as a placeholder where real data is normally present. Therefore, the output circuit 110 can be configured to ignore (e.g., take no operational action) responsive to the dummy data. For example, the output circuit 110 can discard the dummy data, or cycle the dummy data back to the CPU through the output 116, which is coupled to the microcontroller input terminal 108. As described herein, while the SPI circuit 128 provides the dummy data to the data output terminal 106 during the clock compensation mode, the microcontroller 102 is configured to synchronize the continuous PWM signal (e.g., the serial clock signal SCLK) to the SPI clock signal.

As a further example, the continuous clock code 134 is configured to control the CAP circuitry 130 to measure timing of the SPI clock signal (at output terminal 132) and the PWM signal (at output terminal 104) responsive to the compensation activation signal indicating the clock compensation mode. The CAP circuitry 130 thus can provide timing data (e.g., clock values or timestamps) representative of the timing features for one or more respective edges of the SPI clock signal and the PWM signal. For example, the CAP circuitry 130 includes an application programming interface (API) that provides a set of functions for configuring and using the CAP circuitry 130. The continuous clock code 134 can thus use the APIs to configure signal capture functions of the CAP circuitry 130 to measure desired timing features of the PWM signal and the SPI clock signal. For example, the measured timing features can include a rising edge, a falling edge or both rising and falling edges of the respective PWM and SPI clock signals.

The CAP circuitry 130 returns the timing data to the continuous clock code 134 of the CPU 120 (e.g., through the API), which is used for synchronizing the PWM and SPI clock signals. For example, the continuous clock code 134 includes delay calculator code 136 configured to measure a time difference between a rising edge of the SPI clock signal and a rising edge of the PWM signal and to determine a rising edge delay value representative of the time difference. In an additional or alternative example, the delay calculator code 136 can also be configured to measure a time difference between a falling edge of the SPI clock signal and a falling edge of the PWM signal and to determine a falling edge delay value representative of the time difference. The continuous clock code 134 of the CPU 120 is configured to provide timing compensation data to the PWM generator 124 to adjust the PWM signal based on one or both delay values. For example, the CPU 120 is configured to provide the timing compensation data to include a rising edge counter value (referred to herein as RE_CNT). The rising edge compensation data can be stored in a respective register of the PWM generator 124, such as to define a counter value to trigger the rising edge of the PWM signal. The CPU 120 can also be configured to provide the timing compensation data to include a falling edge counter value (referred to herein as FE_CNT). The falling edge compensation data can be stored in another respective register of the PWM generator 124, such as to define a counter value to trigger the falling edge of the PWM signal. In examples herein, in which the PWM signal has a 50% duty cycle, the CPU 120 can determine the falling edge counter value a number of counter cycles equal to one-half of the period of the PWM signal added to the rising edge counter value.

The PWM generator 124 is thus configured to compensate for the determined delay by adjusting the rising and falling edges of the PWM signal based on the timing compensation data (e.g., PWM parameters determined by the CPU 120). The PWM generator 124 is configured to provide the PWM signal at the output terminal 104 with rising and falling edges based on the compensation data, which can be stored in respective registers or other memory (not shown). For example, the rising and falling edge compensation data specifies respective rising and falling edges for each period of the PWM signal. After the measured delay has been compensated during the clock compensation mode, the PWM signal should remain synchronized to the SPI clock signal and can use the same compensation data each period of the PWM signal. In other examples, the continuous clock code 134 can be configured to adjust the compensation data, as needed, to maintain synchronization.

Additionally, after the synchronization is completed, in which the PWM signal is synchronized with the SPI clock signal, the CPU 120 is configured to transition from the clock compensation mode to a normal operating mode. As mentioned, transition can occur after a synchronization time period or based on an amount of dummy data that has been sent by the SPI circuit 128. In the normal operating mode, the SPI circuit 128 can be configured to operate in a direct memory access (DMA) mode, in which the SPI circuit 128 is configured to access the memory 122 independently of the CPU 120. In the DMA mode, the SPI circuit 128 is configured to access SPI data from the memory 122 and provide the SPI output data to the data output terminal 106. As described herein, the SPI data is sent as serial data using the PWM signal at output terminal 104 as a continuous clock signal that is synchronized temporally with the SPI clock signal. The microcontroller 102 thus can implement a continuous clock serial interface, which includes terminals 104, 106 and 108, as a high-speed (e.g., having a frequency range of greater than 2.5 MHz, such as 50 MHz or greater), and low electromagnetic interference (EMI) bus. Additionally, the continuous clock serial interface can be implemented programmatically within the microcontroller 102 to provide a continuous SCLK at output terminal 104, and use a small amount of CPU bandwidth. As a result, additional hardware (e.g., a field programmable gate array) can be eliminated from the system 100, which can reduce the overall cost.

Figure 2:
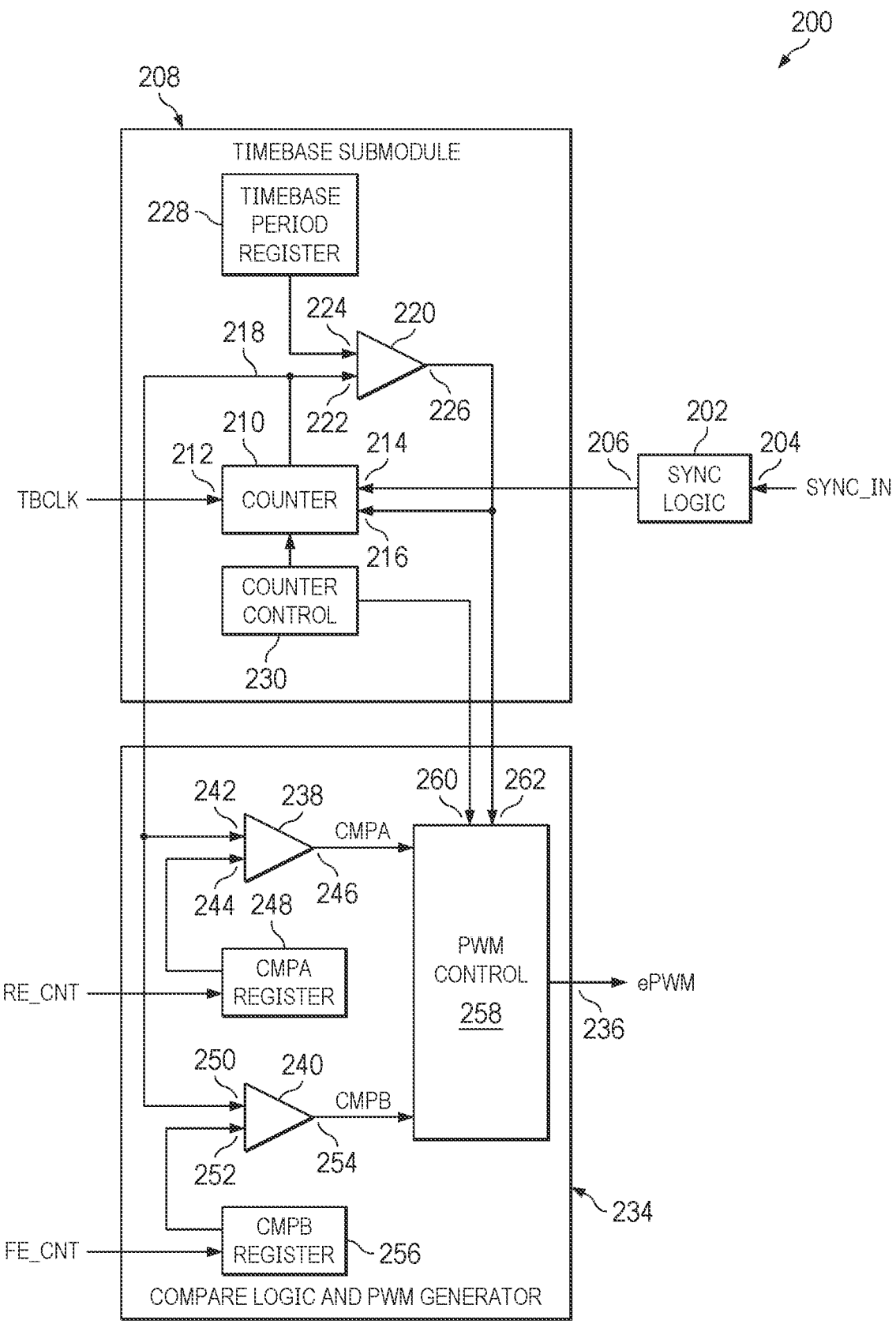
FIG. 2 is a block diagram of an example pulse width modulation generator circuitry.

FIG. 2 is a block diagram of an example PWM generator circuit 200. The PWM generator 200 is a useful example of the PWM generator circuit 124 of FIG. 1, which can be implemented as a module in the microcontroller 102 or another SOC device. Accordingly, the description of FIG. 2 also refers to FIG. 1. In the example of FIG. 2, the PWM generator 200 includes synchronization logic 202 having an input 204 and an output 206, in which the input 204 is configured to receive a synchronization input signal, shown as SYNC_IN, and the output 206 is coupled to an input of a timebase submodule 208. For example, SYNC_IN is an input pulse derived from a previous PWM signal, and the synchronization logic 202 is configured to provide an output logic signal at output 206 based on SYNC_IN and one or more timebase control signals. The timebase submodule 208 can be configured to determine and control event timing for the PWM generator circuit 200. As an example, the timebase submodule 208 is configured to set the period (or frequency) for the PWM signal that is generated. The timebase submodule can also be configured to control counting for the timebase and/or manage synchronization with one or more other instances of the PWM generator circuit 200 that can be implemented in the microcontroller 102.

In the example of FIG. 2, the timebase submodule 208 includes a timebase counter 210 having a clock input 212, a synchronization input 214, a reset input 216 and a counter output 218. The clock input 212 is coupled to a timebase clock source (not shown) to receive a timebase clock signal TBCLK. The synchronization input 214 is coupled to the output 206 of the synchronization logic 202. The counter 210 is a multi-bit counter configured to provide a counter value that is incremented (or decremented) based on the timebase clock signal TBCLK and the synchronization signal received at the input 214. The timebase clock signal TBCLK has a frequency that is greater than a frequency of the PWM signal being generated, such as by one or more orders of magnitude. The timebase submodule 208 can also include a counter control 230 configured to control the counter 210, such as to enable or disable the counter 210 and to set a counting mode (e.g., up or down). The counter control 230 can include one or more register programmable by the CPU 120 to control counter functions.

The timebase submodule 208 also includes a comparator 220 having comparator inputs 222 and 224 and a comparator output 226. The comparator input 222 is coupled to the counter output 218, and the input 224 is coupled to an output of a timebase period register 228. For example, the CPU 120 sets the value of the timebase period, and the comparator 220 is configured to provide a comparator output signal at output 226 based on a comparison of the counter value at input 222 and the timebase period at input 224. The comparator 220 thus provides the comparator output signal at output 226 to reset the counter 210 in response to the counter 210 having a value equal to the timebase period.

The PWM generator 200 also includes a compare logic and PWM generator submodule 234. The compare logic and PWM generator submodule 234 is configured to generate a PWM signal at an output 236. In the example of FIG. 2, the compare logic and PWM generator submodule 234 includes first and second comparators 238 and 240. The first comparator 238 includes inputs 242 and 244 and an output 246, in which one input 242 is coupled to the counter output 218 and the other input 244 is coupled to a compare (CMPA) register 248. The second comparator 240 includes inputs 250 and 252 and an output 254, in which one input 250 is coupled to the counter output 218 and the other input 252 is coupled to a compare (CMPB) register 256. A PWM control circuit 258 has event trigger inputs coupled to the comparator outputs 246 and 254, respectively. The PWM control circuit 258 also includes inputs 260 and 262, in which the input 260 is coupled to an output of the counter control 230 and the input 262 is coupled to the output 226 of the comparator 220.

As a further example, the CPU 120 is configured to store a count value RE_CNT in the CMPA register 248 and another count value FE_CNT in the CMPB register 256. Thus, the CMPA register 248 can store a count value representative of a rising edge event and the CMPB register 256 can store a count value representative of a falling edge event. For example, the comparator 238 is configured to compare the value in the CMPA register 248 to the timebase counter value at counter output 218. When the values are equal, the comparator 238 is configured to generate a trigger event signal at output 246 that is provided to an event trigger input of the PWM control circuit 258 to set a rising edge of the PWM signal at output 236. Similarly, the comparator 240 is configured to compare the value in the CMPB register 256 to the timebase counter value at counter output 218. When the values are equal, the comparator 240 is configured to generate a trigger event signal at 254 that is provided to another input of the PWM control circuit 258 to trigger a falling edge of the PWM signal at output 236. As described herein, the PWM signal provided at output 236 has the same frequency as the SPICLK signal at output terminal 132 and a 50% duty cycle, and the CPU 120 sets the count values RE_CNT and FE_CNT to align the rising and falling edges of the PWM signal with respective rising and falling edges of the SPICLK signal.

Figure 3:
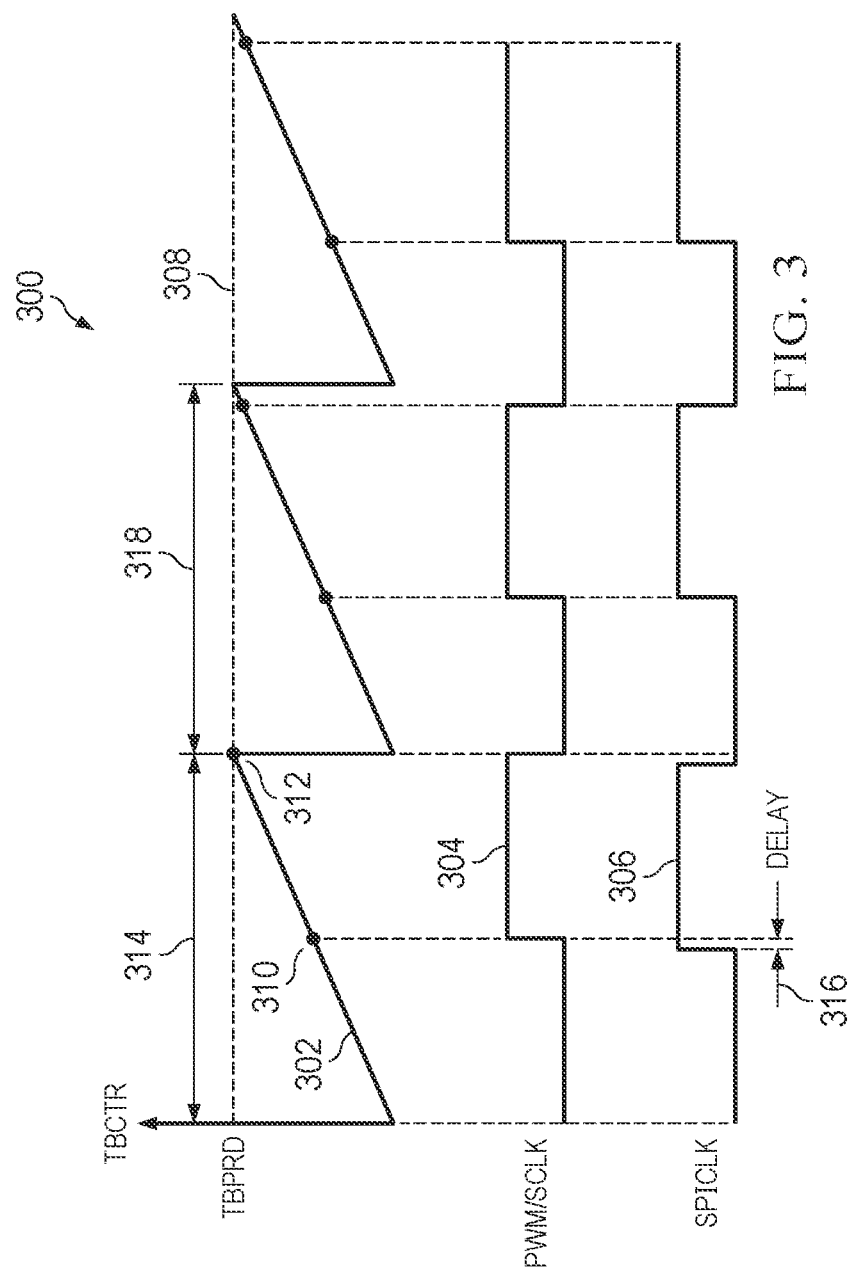
FIG. 3 is a signal diagram showing examples of some signals in the circuitry of FIG. 2.

FIG. 3 is a signal diagram 300 showing examples of some signals 302, 304 and 306 in the PWM generator 200 of FIGS. 1 and 2. Accordingly, the description of FIG. 3 also refers to FIGS. 1 and 2. The signal 302, shown as TBCTR, is an example of the timebase counter output signal provided at counter output 218. The signal 304 is an example of the PWM signal at output 236 and the signal 306 is an example of the SPICLK signal at output terminal 132. The TBCTR signal 302 counts up (e.g., increments) from a starting value (e.g., zero) to a maximum count value defined by a timebase period (TBPRD), shown at 308, and then resets back to the starting value. As described herein, a value to set the timebase period TBPRD can be stored in the timebase period register 228. The rising edge and falling edge count values (RE_CNT and FE_CNT) are also shown at respective count positions 310 and 312 along the TBCTR signal 302.

In the example of FIG. 3, the signals 302, 304 and 306 demonstrate relationships among the signals during a period, shown at 314, prior to synchronization between the PWM signal 304 and the SPICLK signal 306. In the period 314 prior to synchronization, a delay (shown at 316) exists between the rising edge of the PWM signal 304 and the rising edge of the SPICLK signal 306. A corresponding delay also exists between the falling edges of the respective signals. In a next period 318, after synchronization has been performed, as described herein, the rising and falling edges of the PWM and SPICLK signals 304 and 306, respectively, are aligned, such as based on adjustments made to the rising edge and falling edge count values (RE_CNT and FE_CNT) at 310 and 312.

Figure 4:
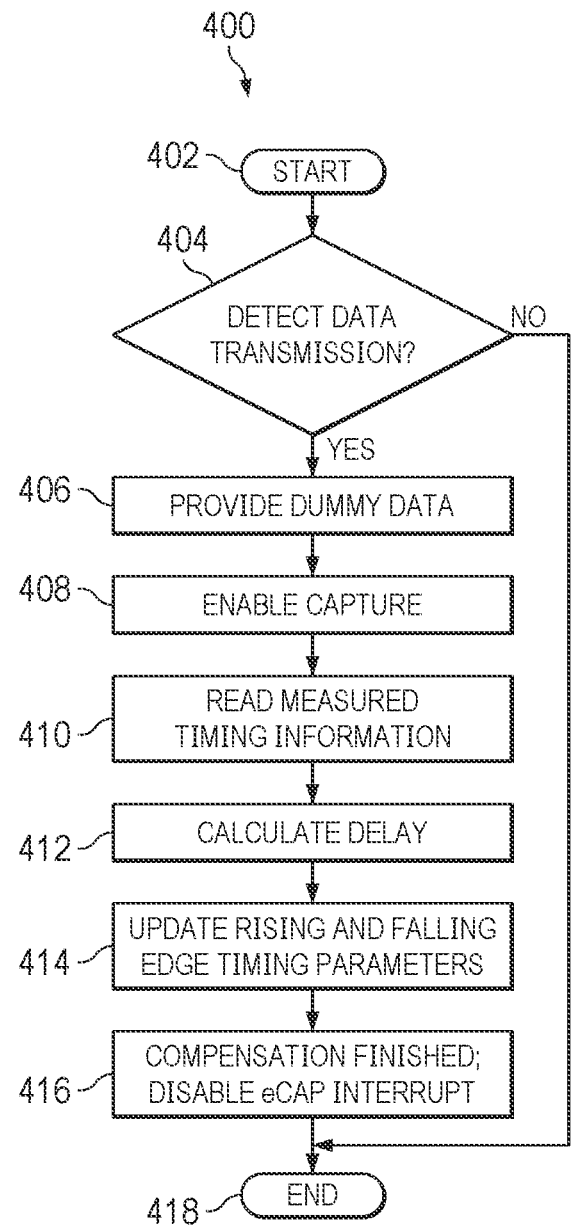
FIG. 4 is a flow diagram showing an example method of providing a continuous clock signal.

FIG. 4 is a flow diagram showing an example method 400 of providing a continuous clock signal, such as part of a continuous clock serial interface. While, for purposes of simplicity of explanation, the method of FIG. 4 is shown and described as executing serially, the method is not limited by the illustrated order, as some actions could occur in different orders, multiple times and/or concurrently from that described herein. The description of the method 400 FIG. 4 will be described with reference to the system 100 of FIG. 1. However, the method 400 can be implemented by a microcontroller or other SOC in any of the systems described herein, including FIGS. 1, 2 and 5. The method 400 starts at 402, such as responsive to power up of the microcontroller 102 configured to implement the method. At 404, a determination is made as to whether data transmission is detected. For example, the CPU 120 or SPI circuit 128 is configured to detect an interrupt request or other signal specifying output data for transmission at the data output terminal 106. For example, continuous clock code 134, which is executed by the CPU 120, enters a clock compensation mode responsive to detecting the data transmission at 404. In some examples, however, if no data is detected for transmission at 404 or if data is detected for transmission after synchronization, the method can proceed from 404 to end at 418.

Additionally, responsive to detecting the data transmission at 404 (e.g., and entering the clock compensation mode), the method proceeds to 406 and dummy data is provided. For example, the CPU 120 provides the dummy data to the SPI circuit 128, which can be provided to the SPI data output. At 408, also responsive to detecting the data transmission at 404, a capture module can be enabled. For example, the CPU 120 is configured to enable (or set) an interrupt routine to invoke functions of the CAP circuitry 130 to measure timing information for the SPI clock signal at output terminal 132 and the PWM signal at output terminal 104. At 410, the measured timing information is read. For example, the CPU 120 is configured to read the measured timing information from the CAP circuitry 130, which timing information can be stored in a register or other memory as a timestamp or counter value. At 412, a delay value is calculated. For example, the CPU 120 includes delay calculator code 136 configured to compute one or more delay values based on a difference in timing information (e.g., rising and/or falling edges) for the SPI clock signal and the PWM signal.

At 414, rising and falling edge timing parameters for the PWM signal are updated. For example, the CPU 120 is configured to store a rising edge count value in the CMPA register 248 and a falling edge count value in the CMPB register 256 based on the computed delay value at 412. At 416 the clock compensation process is completed and the capture module is disabled. For example, after completing synchronization at 414, the CPU is configured to set a flag or other parameter to indicate exiting the compensation mode and disabling the CAP circuitry 130. As described herein, the updated timing parameters (at 414) enable the PWM generator 124 to provide the PWM signal at PWM output terminal 104 as a continuous serial clock signal that is part of a continuous clock serial interface that is synchronized with the SPI clock signal. From 416, the method proceeds to 418 and the method ends.

Figure 5:
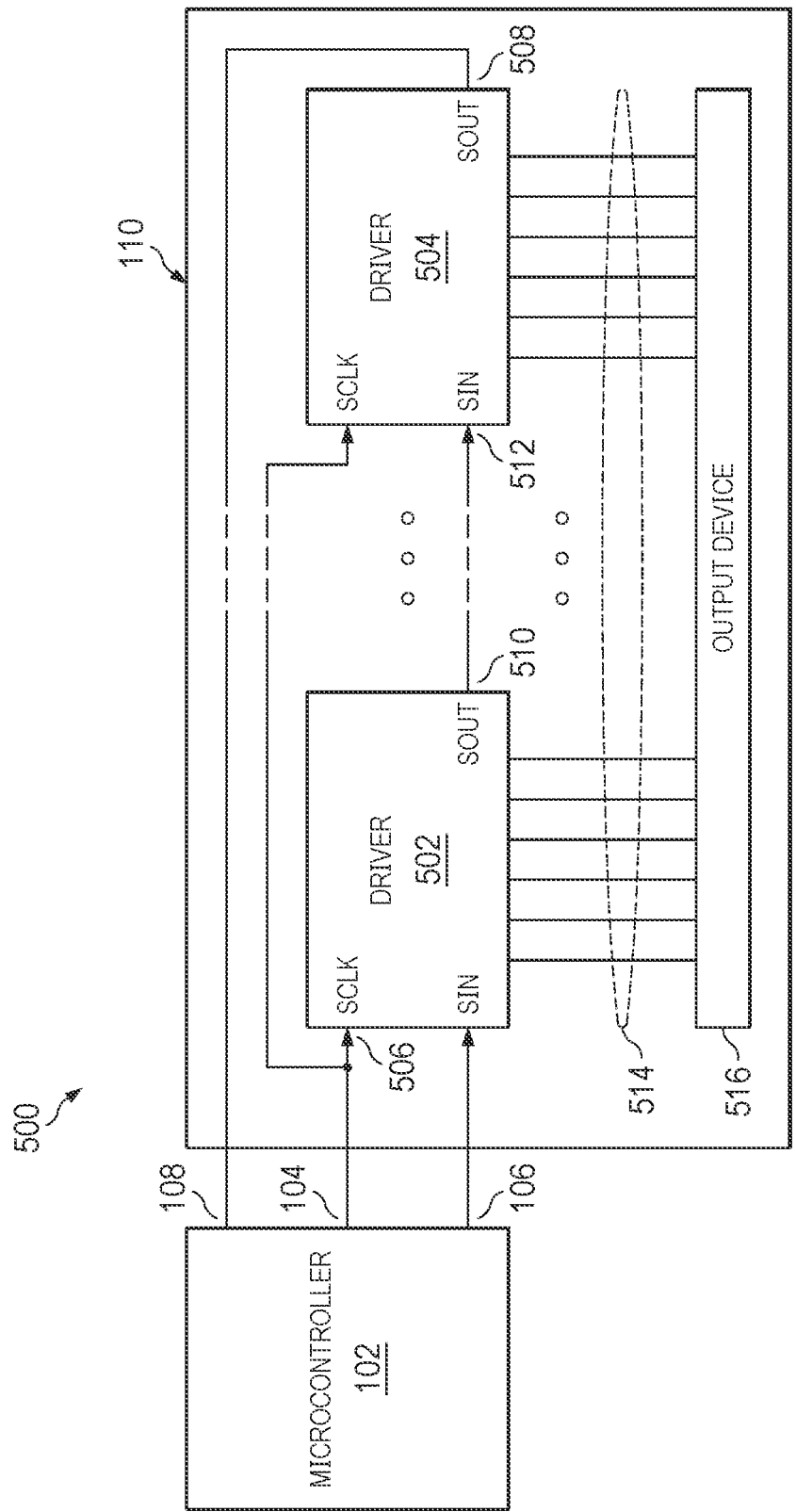
FIG. 5 is a block diagram of an example system implementing a microcontroller using a PWM generator to provide a continuous clock signal to an output circuit.

FIG. 5 is a block diagram of an example system 500 implementing a microcontroller 102 coupled to an output circuit 110. The system 500 provides a useful example of the microcontroller configured to control the output circuit 110 of FIG. 1. Accordingly, the description of FIG. 5 also refers to FIG. 1. Thus, the microcontroller 102 includes a PWM generator 124 configured to provide a continuous clock signal at PWM output terminal 104 as part of a continuous clock serial interface to the output circuit 110. As described herein, the microcontroller 102 can implement the continuous clock serial interface as the high-speed and low EMI bus. In the example of FIG. 5, the continuous clock serial interface of the microcontroller 102 also includes a data output terminal 106 and a data input terminal 108.

The output circuit 110 is coupled to the continuous clock serial interface of the microcontroller 102, which includes the PWM output terminal 104, the data output terminal 106 and a data input terminal 108. The output circuit 110 thus is configured to receive a series clock signal SCLK (a continuous clock signal) and a series input data signal SIN from the microcontroller 102, and is configured to provide a series output data SOUT to the microcontroller.

In the example of FIG. 5, the output circuit 110 includes one or more drivers 502 and 504, which are coupled in a daisy chain arrangement, in which each driver has a clock input coupled to the PWM output terminal 104. A data input terminal 506 of the driver 502 is coupled to the data output terminal 106 and a data output 508 of driver 504 is coupled to the data input terminal 108. A data output terminal 510 of the driver 502 is coupled to a data input terminal 512 of the next driver 504 in the arrangement. While two drivers 502 and 504 are shown in the example of FIG. 5, there can be any number of drivers in other examples.

Each of the drivers 502 and 504 has a number of outputs, shown at 514, which are coupled to one or more output devices 516. In an example, the output device 516 includes an arrangement (e.g., a one or two-dimensional array) of LEDs, and the drivers 502 and 504 are configured to control the display based on the continuous clock signal SCLK at 104 and the synchronous serial data provided by the microcontroller at output terminal 106.

In this description, numerical designations "first", "second", etc. are not necessarily consistent with same designations in the claims herein. Additionally, the term "couple" may cover connections, communications, or signal paths that enable a functional relationship consistent with this description. For example, if device A generates a signal to control device B to perform an action, then: (a) in a first example, device A is directly coupled to device B; or (b) in a second example, device A is indirectly coupled to device B through intervening component C if intervening component C does not alter the functional relationship between device A and device B, so device B is controlled by device A via the control signal generated by device A.

Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor wafer and/or integrated circuit (IC) package) and may be configured to couple to at least some of the passive elements and/or the sources to form the described structure, either at a time of manufacture or after a time of manufacture, such as by an end user and/or a third party.

Modifications are possible in the described embodiments, and other embodiments are possible, within the scope of the claims.

What is claimed is:

1. A circuit comprising:
  a microcontroller having a clock output and a data output, the microcontroller comprising:
    a serial-peripheral interface (SPI) circuit configured to provide an SPI clock signal and an SPI data signal to the data output;
    a pulse-width modulation (PWM) generator configured to provide a continuous PWM signal to the clock output; and
    a central processing unit (CPU) coupled to the SPI circuit and the PWM generator, the CPU having executable instructions configured to synchronize the PWM signal to the SPI clock signal.

2. The circuit of claim 1, wherein the microcontroller further comprises a capture circuit configured to measure respective edges of the SPI clock signal and the PWM signal, in which a time difference between the respective edges of the SPI clock signal and the PWM signal is a delay value representative of the time difference.

3. The circuit of claim 2, wherein the PWM generator is configured to provide the PWM signal based on the delay value.

4. The circuit of claim 1, wherein the SPI circuit is configured to provide the SPI clock signal responsive to a control signal to enable the SPI circuit to provide the SPI data signal.

5. The circuit of claim 1, wherein the microcontroller includes a memory, and the SPI circuit is configured to operate in a direct memory access (DMA) mode, in which the SPI circuit is configured to access the memory independently of the CPU and to provide dummy data to the data output for a duration based on a compensation activation signal having a value representative of a clock compensation mode.

6. The circuit of claim 5, wherein the microcontroller includes a capture circuit configured to measure respective edges of the SPI clock signal and the PWM signal responsive to the compensation activation signal, and the CPU is configured to determine a delay value representative of a delay based on a time difference between the respective edges.

7. The circuit of claim 6, wherein the PWM generator is configured to compensate for the delay and provide the PWM signal based on the delay value.

8. The circuit of claim 7, wherein the PWM signal has a 50% duty cycle and a frequency that matches a frequency of the SPI clock signal.

9. The circuit of claim 5, wherein the SPI circuit is configured to access the memory and provide output data to the data output responsive to the compensation activation signal having a value representative of a normal operating mode.

10. The circuit of claim 9, further comprising a driver having a clock input, a data input and a driver output, in which the clock input is coupled to the clock output, the data input is coupled to the data output, and the driver is configured to provide an output signal to the driver output based on the PWM signal at the clock input and a data signal at the data input.

11. A method comprising:
providing a serial-peripheral interface (SPI) clock signal from an SPI circuit of a microcontroller based on a command to provide SPI output data to a data output of the microcontroller;
providing a continuous pulse-width modulation (PWM) signal to a clock output of the microcontroller; and
synchronizing, by a central processing unit (CPU) of the microcontroller, the PWM signal to the SPI clock signal based on the command to provide the SPI output data.

12. The method of claim 11, wherein the SPI circuit is configured to operate in a direct memory access (DMA) mode, and the method further comprises:
accessing, by the SPI circuit, memory of the microcontroller independently of the CPU; and
providing, by the SPI circuit, dummy data to the data output for a duration based on a compensation activation signal having a value representative of a clock compensation mode.

13. The method of claim 12, further comprising:
measuring a time difference between the SPI clock signal and the PWM signal responsive to the compensation activation signal, and
providing a delay value representative of a delay between the SPI clock signal and the PWM signal based on the time difference.

14. The method of claim 13, further comprising:
compensating for the delay between the SPI clock signal and the PWM signal; and
providing the PWM signal compensated for the delay based on the delay value.

15. The method of claim 14, wherein the PWM signal has a 50% duty cycle and a frequency that matches a frequency of the SPI clock signal.

16. The method of claim 12, wherein the SPI circuit is configured to access the memory and provide output data to the data output responsive to the compensation activation signal having a value representative of a normal operating mode.

17. The method of claim 16, further comprising providing, by a driver circuit, a driver output signal to a driver output based on the PWM signal and the output data at the data output, in which the driver circuit has a clock input and a data input, the clock input is coupled to the clock output, and the data input is coupled to the data output.

18. A system comprising:
a microcontroller having a clock output and a data output, the microcontroller comprising:
a serial-peripheral interface (SPI) circuit configured to provide an SPI clock signal and an SPI data signal, in which the SPI data signal is provided to the data output;
a pulse-width modulation (PWM) generator configured to provide a continuous PWM signal to a PWM output having a 50% duty cycle and a frequency that matches a frequency of the SPI clock signal; and
a central processing unit (CPU) coupled to the SPI circuit and the PWM generator, the CPU having executable instructions configured to synchronize the PWM signal to the SPI clock signal; and
an output circuit having a clock input and a data input, in which the clock input is coupled to the PWM output and the data input is coupled to the data output.

19. The system of claim 18, wherein:
the microcontroller includes a memory,
the SPI circuit is configured to operate in a direct memory access (DMA) mode, in which the SPI circuit is configured to access the memory independently of the CPU and to provide dummy data to the data output for a duration based on a compensation activation signal having a value representative of a clock compensation mode,
the microcontroller includes a capture circuit configured to measure timing of the SPI clock signal and the PWM signal based on the compensation activation signal having the value representative of the clock compensation mode,
the CPU is configured to provide a delay value representative of a delay based on a timing difference between the SPI clock signal and the PWM signal, and
the PWM generator is configured to compensate for the delay and provide the PWM signal based on the delay value.

20. The system of claim 18, wherein the output circuit includes a driver circuit having a driver output and an output circuit having a control input, in which the driver output is coupled to the control input and the driver circuit is configured to provide a drive signal at the driver output based on the PWM signal at the clock input and a data signal at the data input.

* * * * *